United States Patent [19]

Matsushita et al.

[11] Patent Number: 4,865,677
[45] Date of Patent: Sep. 12, 1989

[54] STICKING AND CUTOFF DEVICE FOR ADHERING ADHESIVE TAPE ON THIN ARTICLES

[75] Inventors: Takao Matsushita; Akihiko Kira; Minoru Ametani, all of Osaka, Japan

[73] Assignee: Nitto Electric Industrial Co., Ltd., Osaka, Japan

[21] Appl. No.: 105,775

[22] Filed: Oct. 7, 1987

[30] Foreign Application Priority Data

Aug. 11, 1987 [JP] Japan .................. 62-201185

[51] Int. Cl.$^4$ .................. B26D 5/00; B32B 31/00; G05G 15/00
[52] U.S. Cl. .................. 156/353; 156/248; 156/360; 156/522; 83/368
[58] Field of Search .............. 156/230, 247, 248, 344, 156/584, 254, 250, 353, 354, 355, 510, 513, 522, 521, 361, 362, 364, 360, 552; 83/74, 80, 364, 368, 371

[56] References Cited

U.S. PATENT DOCUMENTS

| | | | |
|---|---|---|---|
| 4,510,009 | 4/1985 | Takagi | 156/353 |
| 4,680,079 | 7/1987 | Tanaka | 156/522 |
| 4,696,712 | 9/1987 | Nouaka | 156/353 |

FOREIGN PATENT DOCUMENTS

58-207496 11/1983 Japan .
61-249299 6/1986 Japan .
2159763 12/1985 United Kingdom .............. 156/249

Primary Examiner—Michael W. Ball
Assistant Examiner—Louis Falasco
Attorney, Agent, or Firm—Sughrue, Mion, Zinn, Macpeak & Seas

[57] ABSTRACT

A device for sticking adhesive tape to thin articles, such as semiconductor wafers, and trimming excess portions of said tape from the thin articles. A plurality of sticking rollers apply adhesive tape from a roll to each thin article, the tape having an adhesive side oriented towards an upper surface of the article and a width greater than a width of the article. A suction stage receives and holds each of the thin articles with the adhesive tape stuck thereto by said sticking rollers while a tape cutter trims the excess portion of the tape from along peripheral edge portions of the article. A tape peeling device then peels off the trimmed excess portions of the tape from the thin article, whereupon the thin article is conveyed back to a cassette.

9 Claims, 8 Drawing Sheets

STICKING AND CUTOFF DEVICE FOR ADHERING ADHESIVE TAPE ON THIN ARTICLES

BACKGROUND OF THE INVENTION

The present invention relates to a device for sticking an adhesive tape to the top of a circular thin article such as a silicon wafer forming a substrate of an integrated circuit, cutting off the tape along the peripheral edge of the thin article, and removing the tape except for the portion stuck to the thin article.

In the prior art, it was generally the practice to manually stick .an adhesive tape to the top of a thin article and then cut the tape along the peripheral edge of the article.

Manually sticking adhesive tape to a thin article and trimming off the excess tape as in the prior art has problems in that a large number of steps are required to perform the work and the tape is likely to be wrinkled.

Also, the applicant disclosed, in Published Unexamined Japanese Patent Application No. 249299/61 an apparatus for trimming excess portions of adhesive tape stuck on a thin article The apparatus includes a stage having groove and a cutting device which moves along the grooves.

SUMMARY OF THE INVENTION

It is an object of the present invention to make it possible to perform fully automatic sticking and cutting of an adhesive tape for thin articles whereby the tape is smoothly applied and cleanly cut.

According to the present invention, a tape sticking and trimming device is provided comprising a loader with which thin articles placed in a cassette are extracted one by one and conveyed between sticking rollers, tape cutting means with which an adhesive tape having an adhesive side on the lower side thereof is continuously stuck to a thin article between the sticking rollers and the tape on the sheet stopped on a stage is cut off along the peripheral edge of the sheet, tape peeling means with which the previously cut-off tape is peeled away to leave the cut-off piece stuck to the thin article on the stage, and an unloader with which the thin article passed through the tape peeling means is put into a cassette. The tape cutting means includes a pointed knife-type cutter capable of being optionally set in a direction of cutting, or a cutter which is displaced to a position over a part of the straight peripheral portion of the thin article and then moved down to cut the adhesive tape, and which is moved along the straight peripheral portion so that a portion of an arc-shaped circumferential surface continuous to the end of the straight peripheral portion is sensed by a detector moved together with the cutter. The direction of the cutter is changed by a detection signal from the detector to orient the cutter in the direction of a tangent to the circumferential surface of .the thin article about the center of the point of contact of the cutter and the thin article, and the cutter is turned about the center of the thin article to move along the peripheral portion of the thin article. The tape cutting means further includes a detector for sensing chips from the thin article, and a detector for detecting abnormal operations of the cutter to stop the driving of the cutter when a chip or abnormality is sensed by the detector. A heater may be provided to increase the temperature of the cutting edge of the cutter to reduce the resistance to the cutter in cutting the adhesive tape so as to make it possible to cut off an adhesive tape which could not be cut by the cutter at room temperatures.

Pinch rollers and peeling rollers can be rotated backward and forward, and the sticking roller can be moved up and down to stick the adhesive tape to the thin article without applying excessive tension to the tape and to pull back the tape to shorten the feeding length of the tape to thereby reduce the consumption of the tape.

According to one aspect of the present invention, a this article, such as a silicon wafer, is placed in the cassette and conveyed between sticking rollers by a loader including conveyor belts; the adhesive tape having the adhesive side on the lower surface is fed between the sticking rollers and stuck to the thin article conveyed between the sticking rollers; the thin article to which the adhesive tape is stuck is moved onto a suction stage and secured thereon; when the thin article is secured on the suction stage, the tape cutting means, which is disposed over the suction stage, is activated to cut off the adhesive tape along the periphery of the thin article with a cutter; after the adhesive tape is cut off, the tape peeling means is operated to peel off the tape and to leave the cutoff piece stuck to the thin article; and the thin article from which the unwanted portion of the adhesive tape has been peeled off is conveyed to the unloader and placed in the cassette.

According to another aspect of the present invention, the direction of the cutter is changed in response to the direct detection of the peripheral edge of the thin article, thus avoiding adverse effects of irregularities in the length of the straight edge of the thin article or irregularities in the stopped position of the article, and hence enabling stable operations.

According to still another aspect of the present invention, the tape cutting means includes a pointed-knife-type cutter having excellent cutting properties; the cutting of the adhesive tape by the cutting means is stopped when it is determined by the detector during the cutting operation that the peripheral edge of the thin article has a chip; and if the cutter begins to deviate in the radial or circumferential direction of the thin article, such deviation is sensed by the other detector to stop the cutting of the adhesive tape to protect the thin article from damage.

According to still another feature of the present invention, the cutting edge of the cutter is heated to reduce resistance to the cutter in cutting the adhesive tape, making the cutting operation more easy.

According to still another portion of the present invention, elongation of the adhesive tape is reduced to prevent the tape from warping upward or separating from the thin article when the adhesive property of the tape is poor, and the adhesive tape is wound back by a prescribed length after every sticking and cutting operation so as to reduce consumption of the tape, enhancing productivity and stabilizing the operation of the equipment.

DESCRIPTION OF THE PREFERRED EMBODIMENTS

A preferred embodiment of the present invention, which is a device for sticking an adhesive tape to a wafer such as a thin article and trimming off the excess tape, will hereafter be described with reference to the drawings.

Figure 1:
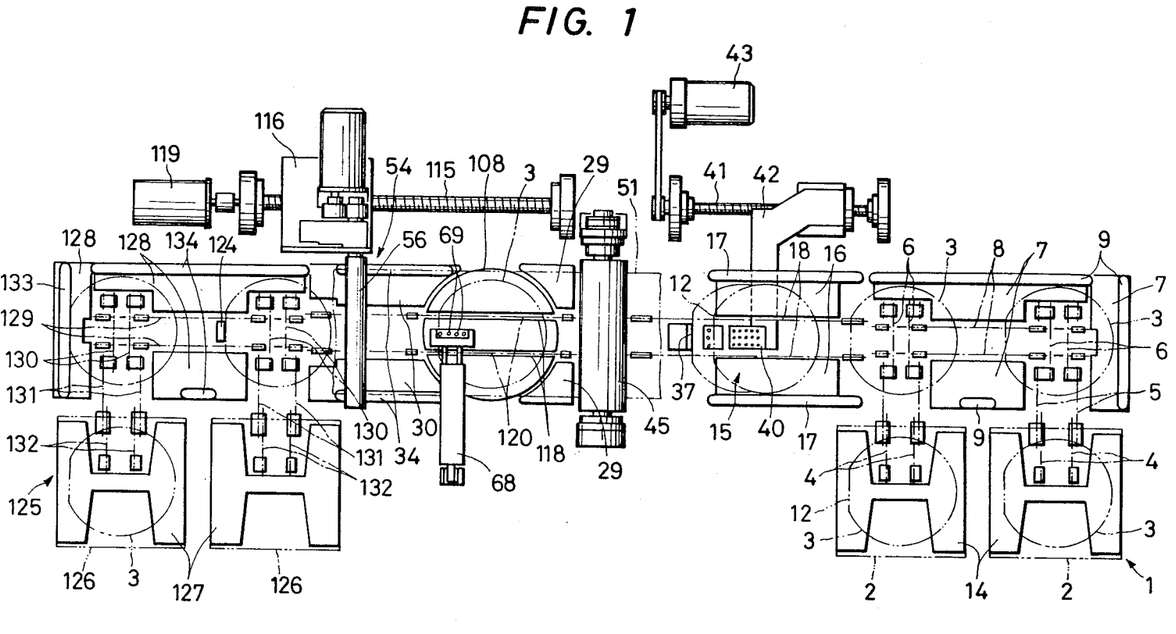
FIG. 1 is a plan view of a preferred embodiment of the present invention.
Figures 3, 4:
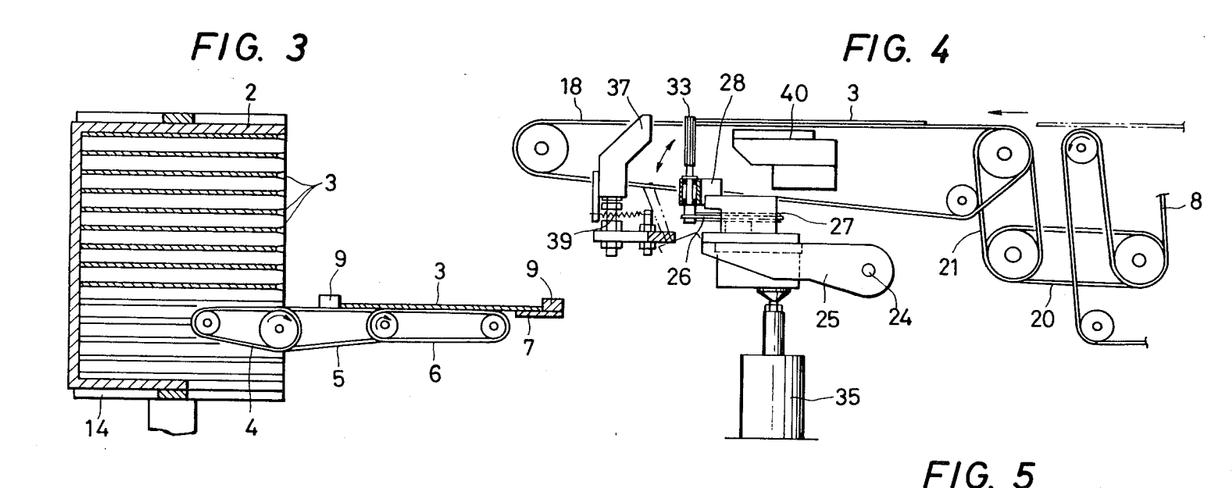
FIG. 3 shows an enlarged longitudinal sectional view of a loader at and near a cassette in the FIG. 1 embodiment.
FIGS. 4 and 5 are partially sectional front views of an alignment device in different states.

FIG. 1 shows a loader 1 having a pair of right and left rests 14 on which cassettes 2 containing wafers 3 are placed. As shown in FIG. 3, a large number of wafers 3 are stacked at appropriate intervals in each of the cassettes 2 in such a manner that the semiconductor element forming side of each of the wafers is located on the lower surface thereof.

Figure 2:
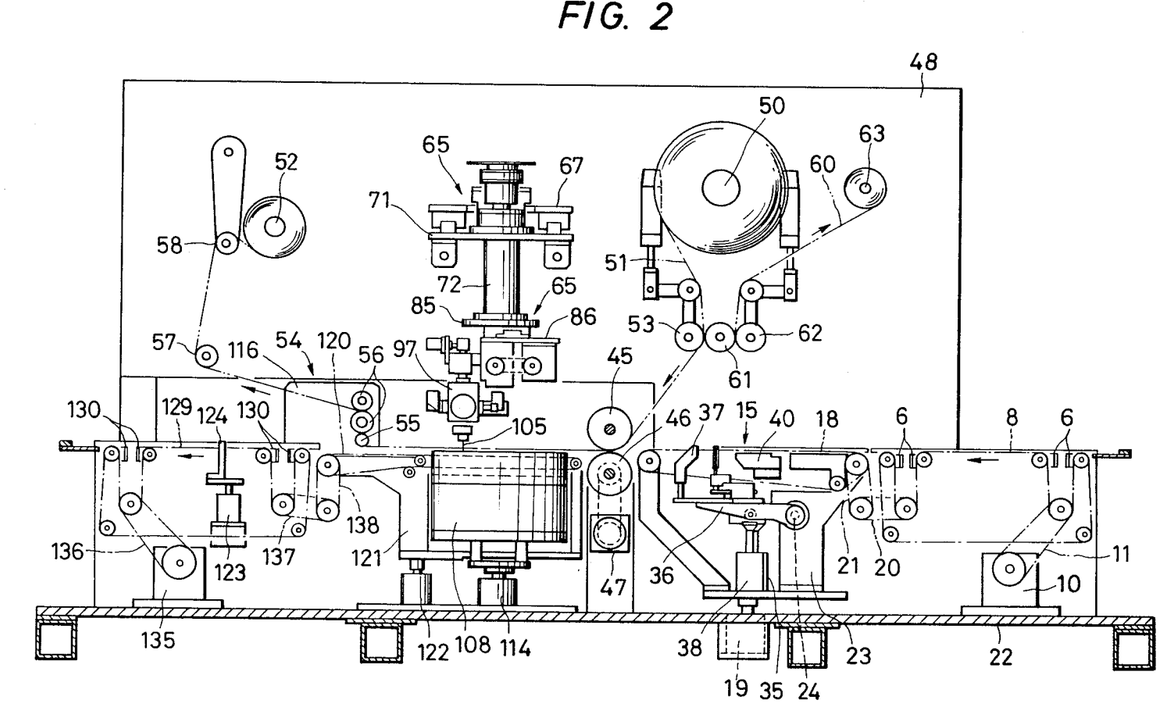
FIG. 2 shows a front view of the preferred embodiment.

The lowermost wafer 3 in the cassette 2 is sent onto a guide rest 7 by endless conveyor belts 4, 5 and 6. As shown in FIG. 1, the guide rest 7 is divided into a plurality of portions between which the conveyor belts 6 and other endless conveyor belts 8 extending perpendicularly across the belts 6 are provided and to which a plurality of guide bars 9 are secured. As shown in FIG. 2, the conveyor belts 8 are bent by a plurality of pulleys so as not to interfere with the conveyor belts 6. After the wafer 3 is sent onto the guide rest 7 by the conveyor belts 6, the belts 6 are stopped. The conveyor belts 8 are then driven, in the direction of an arrow shown in FIG. 2, by a motor 10 and a drive belt 11 to send the wafer 3 to a wafer alignment device 15.

Each of the rests 14 is vertically moved by a vertical conveying device (not shown in the drawings). Every time one wafer 3 is extracted from the cassette 2, the cassette 2 is moved down with the rest 14 to place a subsequent wafer 3 on the conveyor belts 4. When the cassette 2 on one rest 14 is emptied of wafers 3, those in the other cassette 2 on the other rest 14 are extracted to thus provide a continuous operation. At the same time, the emptied cassette 2 is replaced by another cassette 2 containing other wafers 3. The rate of operation of the device is thus enhanced. It is for this reason that the pair of right and left rests 14 are provided. However, if only one cassette is set in the loader, only one rest need be provided therein, which may be loaded at an optional position opposed to the conveyor belts 8.

In the wafer alignment device 15, guide bars 17 are provided over the outside portions of right and left rests 16, between which a pair of right and left endless conveyor belts 18 are disposed. The conveyor belts 18 are moved synchronously with the conveyor belts 8 by drive belts 20 and 21, as shown in FIG. 2. The conveyor belts 8 are provided on a vertical movement frame 23 on a base 22. The frame 23 is vertically moved by an air cylinder 19.

The wafer alignment device 15 will now be described in detail with reference to FIGS. 2, 4, 5 and 6. The frame 23 is fitted with a lever 25, which is swung about a horizontal shaft 24. A grooved pulley 27, which is rotated about a vertical shaft by a motor, is provided on the lever 25: As shown in FIG. 6, three rotary bars 31, 32 and 33 are provided on a mount 28 on the lever 25. An endless belt 26 is engaged in the grooved pulley 27 and grooved pulleys provided at the lower ends of the rotary bars 31, 32 and 33 so that the bars are rotated as shown by arrows in FIG. 6. The central rotary bar 32 is loaded slightly forward of the other rotary bars. The lever 25 can be swung up and down by an air cylinder 35.

Figure 5:
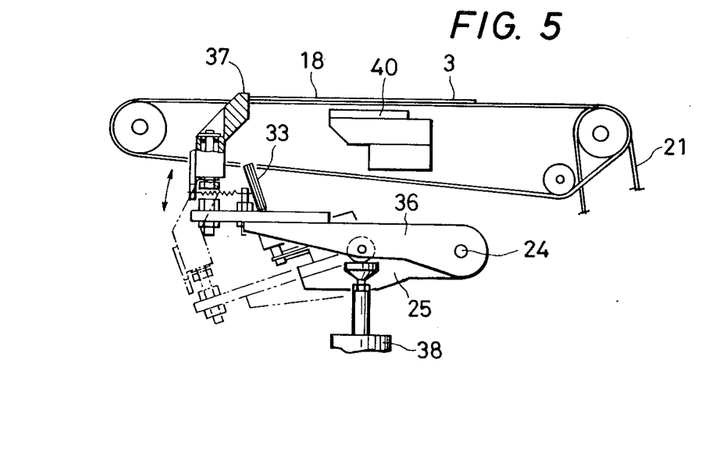
Figure 6:
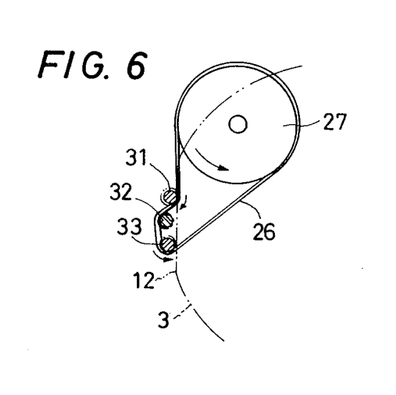
FIG. 6 shows a plan view of a major part of the embodiment.

Shown at 36 in FIGS. 2 and 5 is a lever which is coaxial with the horizontal shaft 24 and is swung independently of the lever 25. A stopper 37 is attached to the lever 36 to accurately position the straight edge 12 of the wafer 3. The stopper 37 is provided with a mechanism which turns the stopper about a rotary shaft 39 and secures the stopper at an optional angle to finely adjust the position of the contact surface of the stopper. The lever 36 is swung up and down by an air cylinder 38.

At first, the three rotary bars 31, 32 and 33 and the stopper 37 of the alignment device 15 remain protruded above the conveying surfaces of the conveyor belts 18, as shown in FIGS. 2 and 4, so that a peripheral edge of the wafer 3 conveyed by the belts 18 can come into contact with the peripheral surfaces of the rotary bars. If the peripheral edge of the wafer 3 is curved, the edge comes into contact with the peripheral surfaces of all the rotary bars 31, 32 and 33 and the wafer is turned due to frictional engagement with the two neighboring bars 32 and 33 which rotate in the same direction. When the straight edge 12 of the wafer 3 has reached the bars 31, 32 and 33 as a result of the turning of the wafer 3, the straight edge does not move into contact with the central rotary bar 32 but moves into contact with the other rotary bars 31 and 33 which rotate in opposite directions to each other. As a result, the wafer 3 is stopped so that the straight edge 12 thereof is located in the front.

When it is detected that the wafer 3 is present on the wafer alignment device 15, the rotary bars 31, 32 and 33 are rotated. When it is detected that the straight edge 12 of the wafer 3 has come into contact with the rotary bars 31 and 33, the rotation of the rotary bars 31, 32 and 33 is stopped and the bars are moved downward by the air cylinder 35. At that time, the wafer 3 is moved forward on the belts 18 so that the straight edge 12 located in front comes into contact with the stopper 37 and is thereby accurately positioned, as shown by a chain line in FIG. 1, or as shown in FIG. 5. The angle of the stopper 37 can be very finely adjusted by the abovementioned fine adjustment mechanism.

Figure 7:
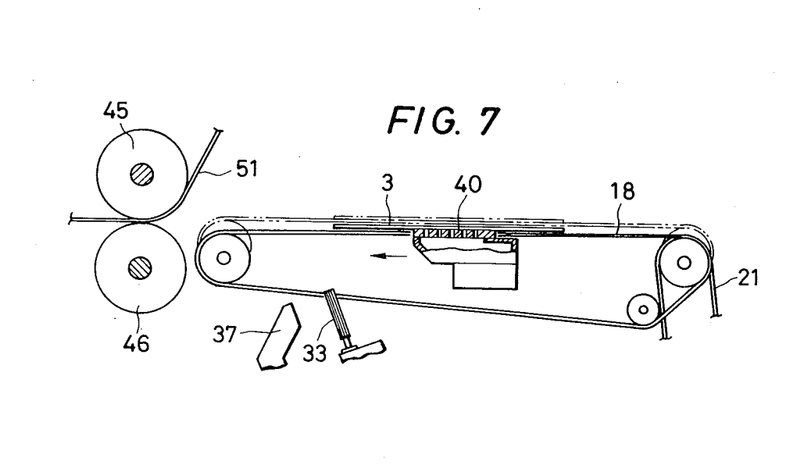
FIG. 7 is a partially sectional front view of the embodiment at and near a moving stage.
Figure 8:
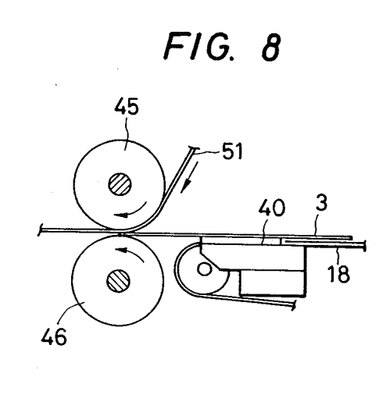
FIG. 8 is a partially sectional front view of the embodiment at and near sticking rollers.

When it is detected by a photoelectric detector or the like that the wafer 3 has reached the stopper 37, the air cylinder 19 is operated to lower the conveyor belts 18 together with the frame 23 to transfer the wafer 3 onto a moving stage 40, as shown in FIG. 7. After it is confirmed that the wafer 3 is on the stage 40, an air cylinder 38 is activated to lower the stopper 37, as shown by a chain line in FIG. 5.

As shown in FIGS. 1 and 7, the moving stage 40 is located between the right and left conveyor belts 18 and has a hollow body having numerous vacuum suction holes in the top thereof. The stage 40 is attached to the tip of an arm 42, which is moved back and forth by the forward and backward rotation of a feed screw 41, the latter being supported by a bearing on the base 22 and driven by a reversible motor 43.

When the conveyor belts 18 are lowered to transfer the wafer 3 onto the moving stage 40 and hold the wafer by vacuum and the stopper 37 is lowered as described above, the feed screw 41 is rotated forwardly by the motor 43 to move the arm 42 leftward in FIG. 1 to displace the wafer between the sticking rollers 45 and 46.

The sticking rollers 45 and 46 are made of a soft elastic material such as rubber. Appropriate downward pressure is applied to the upper sticking roller 45 by a balancing weight mechanism (not shown in the drawings). The lower sticking roller 46 is driven and braked by a drive/brake unit. 47 including a motor. The drive shaft of the roller 46 is provided with an electromagnetic clutch and a torque damper (not shown in the drawings). When the clutch is engaged, the roller 46 is braked. Another clutch and another motor may be provided to intermittently drive the roller 46.

As shown in FIG. 2, a reel 50 for feeding the adhesive tape 51 and a reel 52 for winding the tape are provided in a casing 48 on the base 22. The adhesive tape 51 fed from the reel 50 along a guide roller 53 is moved between the upper and the lower sticking rollers 45 and 46 with the adhesive side of the tape located on the downward side thereof. The tape 51 is then moved between the lower peeling roller 55 of a tape peeling device 54 and a pair of upper and lower peeling rollers 56 and wound on the winding reel 52 along a guide roller 57 and a tension roller 58 provided in the casing 48. A separator 60 for the adhesive tape 51 is wound on a winding reel 63 along a separator elevation roller 61 and a pinch roller 62.

An acrylic or rubberous substance having a pressure-sensitive adhering property at room temperature is applied to one side of a backing of the adhesive tape 51 made of a film of a substance such as polyethylene and polypropylene.

In the separator 60, a low adhesive substance such as a silicone compound is applied to the surface of a plastic film or paper.

As soon as the wafer 3 is received between the sticking rollers 45 and 46 by the moving stage 40, the vacuum suction of the wafer by the stage is stopped and the motor 43 is rotated backward to return the stage to its original position and raise the frame 23 and the levers 25 and 36 to their original positions to receive a following wafer.

The adhesive tape 51 is stuck, under a roller line pressure of 300 to 3,000 g, to the top of the wafer 3 moving between the sticking rollers 45 and 46, as described above. The wafer 3 is moved at a speed of about 5 to 20 m/min, and then held stationary upon the operation of a plurality of photoelectric detectors 69 provided at the tip of an arm 678 which can be protruded and retracted.

Figure 11:
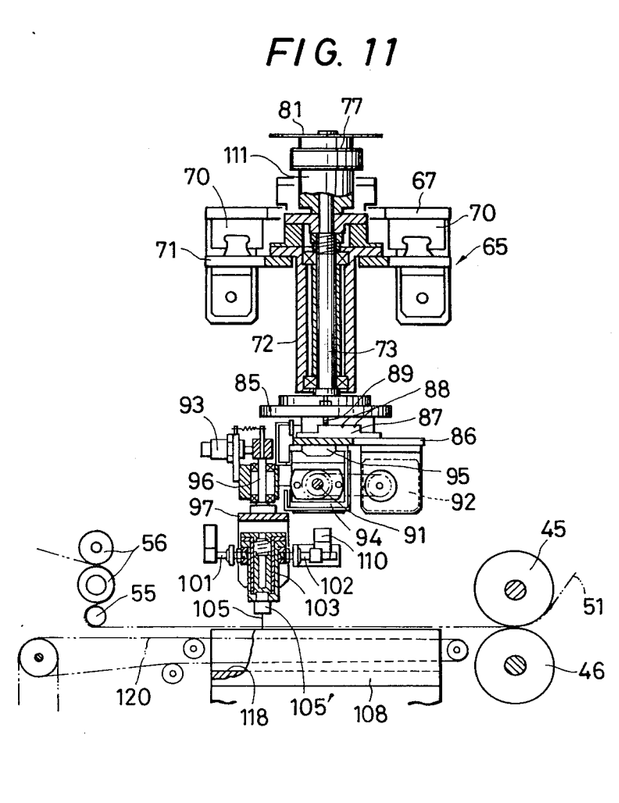
FIG. 11 is a partially sectional front view of the tape cutting device.
Figure 12:
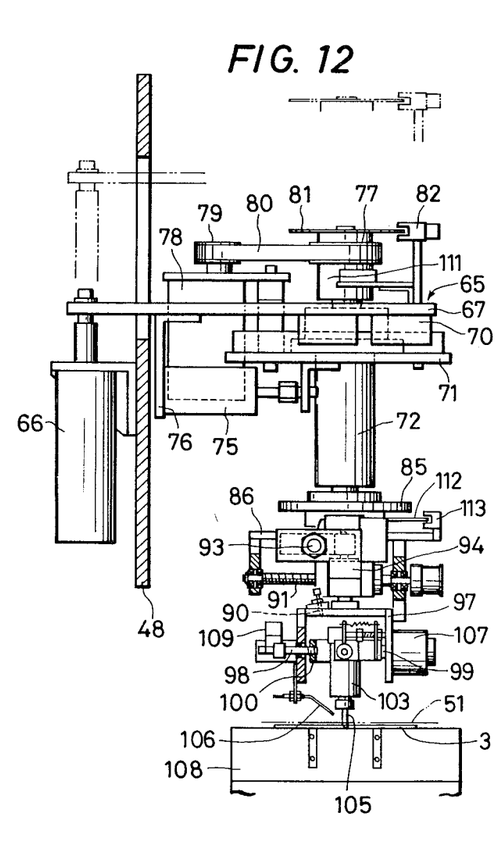
FIG. 12 is a partially sectional side view of the tape cutting device.

As shown in FIGS. 11 and 12, a tape cutting device 65 is provided on a vertical movement frame 67, which is moved up and down by a vertical air cylinder 66 secured to the inside surface of the side wall of the casing 48.

A movable rest 71, which is moved back and forth along a pair of right and left horizontal guides 70 perpendicularly to the direction of conveyance of the wafer 3, is provided under the vertical movement frame 67. An air cylinder 75 for driving the movable rest 71 is secured to a bracket 76 under the vertical movement frame 67.

A vertical cylindrical member 72 is secured to the movable rest 71 and directed downward. A rotary shaft 73 is fitted in the cylindrical member 72. A pulley 77 is secured to the upper portion of the rotary shaft 73. The pulley 77 and a pulley 79 provided on the shaft of a motor 78 secured to the vertical movement frame 67 are drivingly connected to each other by a drive belt 80. A detection plate 81 is secured to the upper end of the rotary shaft 73. An original position detector 82, such as a photoelectric unit and a proximity switch, senses the presence of the detection plate 81 through a photoelectric action or the like. The detector 82 is located at the upper end of a pillar on the vertical movement frame 67.

A support plate 85 is secured to the lower end of the rotary shaft 73. An adjusting plate 86 horizontally movable on a guide is provided under the support plate 85. A block 87 is secured to the top of a portion of the adjusting plate 86. A setting screw 89 theadedly engaged with the support plate 85 is engaged in one of notches 88 in the top of the block 87 to perform adjustment of the size of the cassette 2. A horizontal feed screw 91 is rotatably supported under the adjusting plate 86 so that the feed screw is rotated backward and forward through a drive belt by a motor 92 secured under the adjusting plate 86.

A slider 94 is theadedly engaged with the feed screw 91 and moved along a guide 95 under the adjusting plate 86. A frame 97 shaped as an inverted U is secured to the lower end of a vertical shaft 96 supported at a side of the slider 94 so that the vertical shaft can be rotated by an air cylinder 93.

A frame 100 is mounted in the frame 97 in such a manner that the frame 100 can turn about horizontal shafts 98 and 99 extending outward from both the ends of the frame 100. A cutter attaching member 103, which extends vertically and is shaped cylindrically, is supported in a swingable manner in the frame 100 by horizontal shafts 101 and 102 located at both the sides of the cutter attaching member and extending perpendicularly across the horizontal shafts 98 and 99. A cutter hole 105', to which a pointed-knife-type cutter 105 directed downward is secured, is removably secured to the lower end of the attaching member 103.

Shown at 90 in FIG. 12 is a photoelectric detector provided on the frame 97. The detector 90 emits light and detects the peripheral edge of the wafer 3 from changes in the reflected light. The cylinder 93 is controlled by a signal from the detector 90 to turn the vertical shaft 96 to alter the rotative position of the cutter 105.

Shown at 106 in FIG. 12 is a photoelectric detector secured to the lower end of one side wall of the frame 97 to project light to the peripheral portion of the wafer 3 to detect chips from the wafer by sensing the reflected light.

An electromagnetic brake 107 is provided on the other side wall of the frame 97. The shaft 99 is locked by the brake when a chip from the wafer 3 is sensed by the detector 106. This operation can be performed on condition that the adhesive tape 51 is transparent or translucent.

A photoelectric detector 109 is provided to detect the rotative angle of the shaft 98 to sense deviations of the cutter 105 in the radial direction of the wafer 3.

A photoelectric detector 110 is provided to detect the rotative angle of the shaft 102 to sense deviations of the cutter 105 in the circumferential direction of the water 3.

In each of the detector 109 and 110, the interception of light by a moved light blocking plate or the like secured to the shaft is detected by a photoelectric element or the like.

A torque limiter 111 is provided on the vertical movement frame 67 to detect loading of the cutter 105 and to accordingly stop the motor 78.

A detection plate 112 is provided for the adjusting plate 86. The presence of the plate 112 is sensed by a photoelectric detector 113 to detect the original position of the cutter 105. The shafts 96, 98 and 102 are provided with restoring springs to maintain the cutter 105 in a vertical stationary posture as long as the resistance thereto is not higher than a prescribed level.

A vacuum suction stage 108 provided under the tape cut-off device 65 has numerous suction holes or grooves in the top thereof so that the wafer 3 when moved onto the stage is held thereon by vacuum suction. Further, the edge portion (excess portion) of the adhesive tape 51 can be held by the vacuum force. The stage 108 is moved up and down by an air cylinder 114 shown in FIG. 2, but may be permanently secured instead. The top of the stage 108 has a plurality of circular grooves 104 (shown in FIG. 10) which are concentric to each other and coincide with the peripheral edges of plural kinds of wafers. The top of the stage 108 also has two grooves 118 extending parallel to the direction of movement of the wafer 3. Endless conveyor belts 120 for conveying the wafer are located in the grooves 118. A movable frame 121 fitted with the endless conveyor belts 120 as shown in FIG. 2 is moved up and down by an air cylinder 122 to move the conveyance surfaces of the conveyor belts 120 up and down with respect to the top of the stage 108.

However, if a conveyance system based on air buoyancy is adopted, the grooves 118 need not be provided and the length of each of the conveyor belts 120 may be reduced. In that case, the stage 108 is provided with conveying air blow-off nozzles, rather than the suction holes or grooves, or it may be provided with suction holes or grooves which also function as conveying air blow-off nozzles through the change over of an air circuit.

As shown in FIG. 1, guide rests 29 and 30 are provided around the stage 108, and guide bars 34 are provided on the outside of the guide rests 30.

In the tape peeling device 54, the peeling roller 55 and the upper and lower peeling rollers 56 are disposed on a moving rest 116, which is moved back and forth by the backward and forward rotation of a feed screw 115. The upper and lower peeling rollers 56 are drivingly connected to each other through gears so that the upper and lower peeling rollers are rotated in opposite directions to each other. The feed screw 115 is driven by a reversible motor 119.

Figures 9, 10:
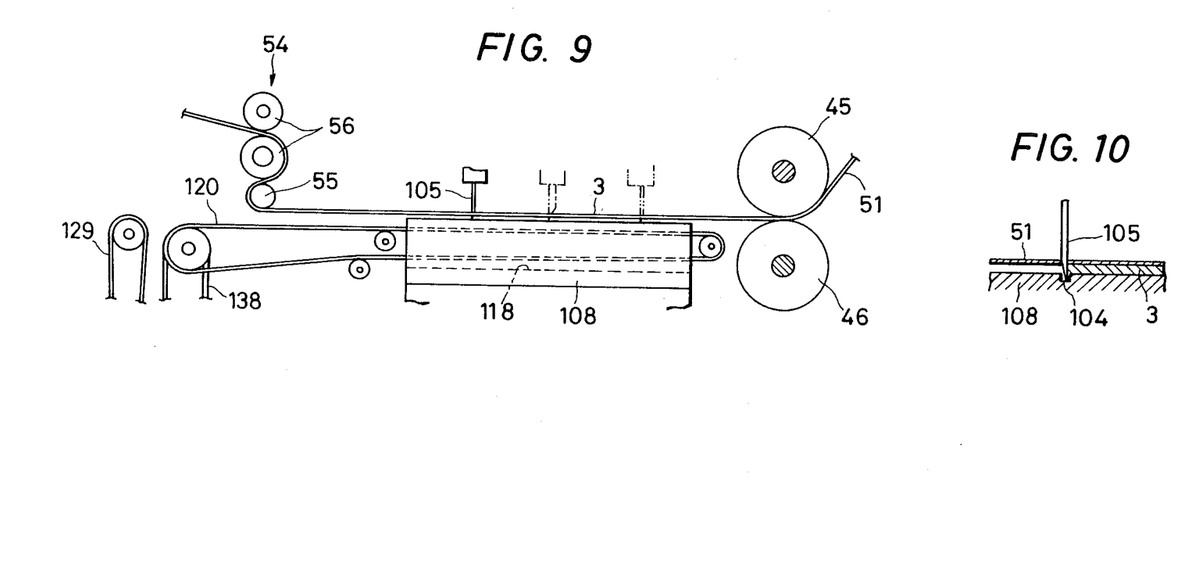
FIG. 9 shows a front view of a part of a tape cutting device in the embodiment.
FIG. 10 is an enlarged longitudinal sectional view of part of the tape cutting device.
Figure 15A:
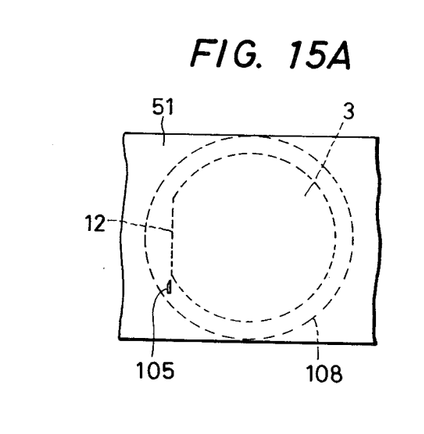
FIGS. 15A, 15B, 15C, 15D and 15E show plan views indicating the cut states of an adhesive tape.

When the tape peeling device 54 is stationary, the wafer 3 is stuck to the lower surface of the adhesive tape 51 tightened between the peeling roller 55 and the sticking rollers 45 and 46 and located on the rising suction stage 108, while the conveyor belts 120 are lowered with their conveyance surfaces located below the top of the stage 108, as shown in FIGS. 1, 2 and 9. The movable rest 71 is then moved forward by the air cylinder 75 (shown in FIG. 12) and the air cylinder 66 (shown in FIG. 12) and then activated to lower the vertical movement frame 67. As a result, the cutter 105 cuts into the stopped adhesive tape 51 as shown in FIG. 15a. At that time, the cutter 105 is oriented in the same direction as the straight edge 12 of the wafer 3.

Figure 15B:
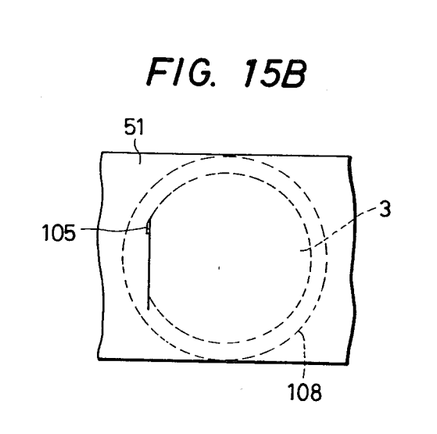
Figure 15C:
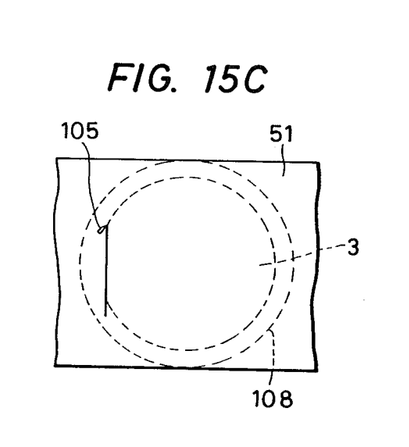

After that, the air cylinder 75 is activated to displace the movable rest 71 leftward in FIG. 12 to move the cutter 105 toward the straight edge 12 of the wafer 3 to cut the adhesive tape 51 until the center of the rotary shaft 73 coincides with those of the wafer 3 and the suction stage 108. When the center of the rotary shaft 73 coincides with those of the wafer 3 and the suction stage 108, the air cylinder 75 is stopped. The motor 92 is then started to rotate the feed screw 91 to move the slider 94. The cutter 105 is thus moved straightwardly so that the adhesive tape 51 is cut off along the straight edge 12 of the wafer 3 to the end of the straight edge, as shown in FIG. 15B. At that time, the circumferential portion of the wafer 3 is sensed by the photoelectric detector 90, and hence the cylinder 93 is activated by a signal from the detector to turn the shaft 96 to orient the cutter 105 in a tangential direction on the circumferential edge of the wafer 3, or slightly more inward than the tangential direction as shown in FIG. 15C.

Figure 15D:
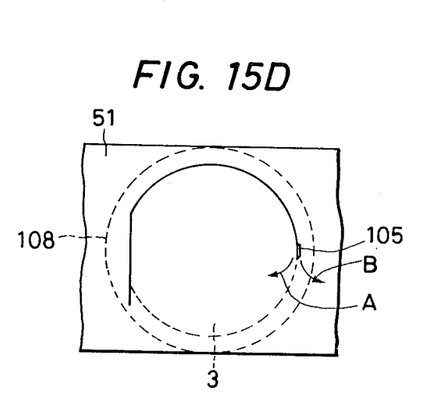
Figure 15E:
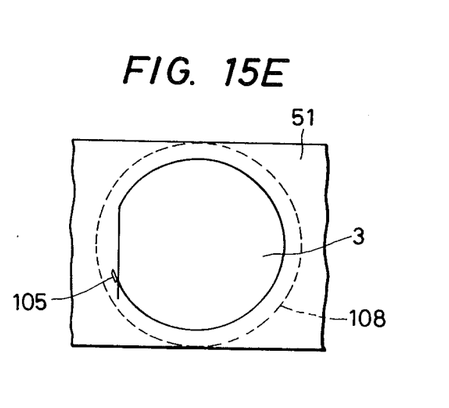

At the same timing as the action of the cylinder 93, the motor 78 is started to turn the rotary shaft 74 through the pulley 79, the belt 80 and the pulley 77 to cut off the adhesive tape 51 with the cutter 105 along the circumferential edge of the wafer 3, as shown in FIGS. 15D and 15E.

When a peripheral chip from a wafer 3 being moved immediately ahead of the cutter 105 during the abovedescribed cutting of the adhesive tape 51 is sensed by the photoelectric detector 105, the electromagnetic brake 107 is activated to lock the shaft 98 to keep the cutter 105 from being turned about the shaft so as to prevent the cutter from cutting into the chip.

If the cutter 105 deviates in the radial direction of the wafer 3, as shown by an arrow A or B in FIG. 15D, the frame 100 is turned together with the shafts 98 and 99. The turning of the frame 100 is sensed by the photoelectric detector 109 to stop the motor 78 to protect the wafer 3 from damage.

If the cutter 105 is unable to cut the adhesive tape 51 and has deviated in the circumferential direction of the wafer 3, the turning of the attaching member 103 together with the shafts 101 and 102 is sensed by the photoelectric detector 110 to stop the motor 78.

If the cutter 105 is overloaded, the torque limiter 111 acts to stop the motor 78 through the limit switch of the limiter.

As shown in FIG. 10, the cutter 105 cutting the adhesive tape 51 is received in the groove 104 of the suction stage 108 to ensure the cutting of the tape.

If an electric heating wire is provided in the attaching member 103 to heat the cutter 105 it is made easy for the cutter to cut off an adhesive tape made of polyolefin or the like.

When tape on a completely circular wafer having no straight edge is to be cut off, straight movement of the slider 94 by the motor 92 is not performed.

If the size of the wafer 3 is altered, securing screws (not shown in the drawing) are loosened to move the adjusting plate 86 to engage the lower end of the setting screw 89 in a desired notch 88, and the adjusting plate is then secured again.

If the cut-off piece of the adhesive tape 51 is larger than the wafer 3, a profiling plate is secured over the suction stage 108 and the cutter 105 is moved along the outer portion of the profiling plate to cut off the tape to provide the cut-off piece with an optimum size.

Figure 13:
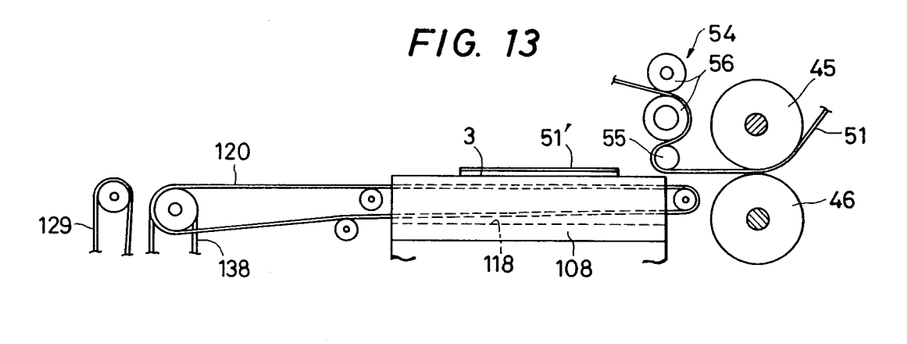
FIGS. 13 and 14 show enlarged front views of a tape peeling device.
Figure 14:
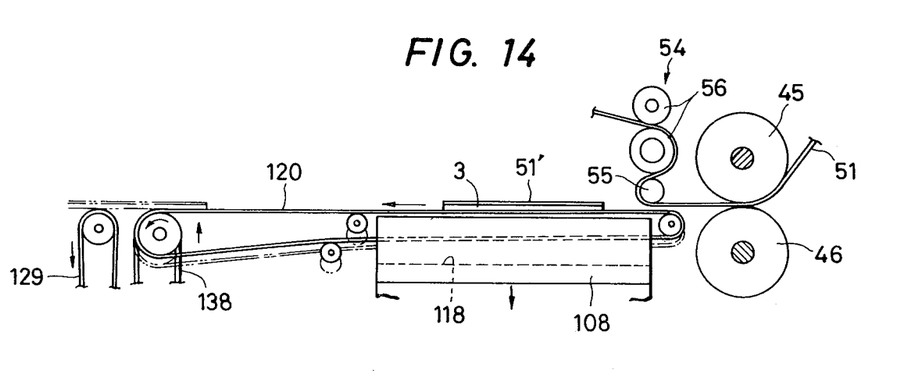

As soon as the cutter 105 is raised together with the vertical movement frame 67 by the air cylinder 66 at the time of the completion of the cutting of the adhesive tape 51 by the cutter 105, the cutter is returned to its original position through the operation of original position detectors 82 and 113 and the sticking roller 46 is braked so that the movement of the tape is stopped. The reversible motor 119 is then started to rotate the feed screw 115 to move the tape peeling device 54 rightward in FIGS. 1 and 2 to peel the tape 51 and to leave its cut-off piece 51' stuck to the wafer 3, as shown in FIG. 13. After that, the cylinders 114 and 122 are put into action to move the suction stage 108 and raise the frame 121 to transfer to wafer 3 from the stage 108 to the belts 210, as shown in FIG. 14. At the same time, the belts 120 are driven to convey the wafer 3 to an unloader 125.

The unloader 125, which functions inversely to the loader 1, includes a pair of right and left rests 127, on which cassettes 126 containing the wafers 3 with the cutoff tapes 51' stuck thereto are placed, and a guide rest 128 located upstream of the rests 127, as shown in FIG. 1. The guide rest 128 is divided into a plurality of portions between which a pair of right and left endless conveyor belts 129 extending to the endless conveyor belts 120 are provided. Pairs of right and left endless conveyor belts 130, 131 and 132 are sequentially disposed between the conveyor belts 129 and the rests 127 and extend perpendicularly to the belts 129, whereby the wafers 3 are loaded into the cassettes 126 by the conveyor belts 130, 131 and 132.

As shown in FIG. 2, the belts 129 are bent by a plurality of pulleys so as not to interfere with the belts 130, and are driven by a motor 135 through a drive belt 136 in the direction of an arrow shown in FIG. 2.

The conveyor belts 120 are drivingly connected to the belts 129 by endless drive belts 137 and 138.

When the wafer 3 sent to the unloader 125 reaches the prescribed conveyor belts 130, movement of the conveyor belts 129 is stopped and the conveyor belts 130, 131 and 132 are started to convey the wafer into the cassette 126 on the prescribed rest 127.

Each of the rests 127 is a conventional rest which is lowered every time one wafer is conveyed into the cassette 126. For example, after the cassette 126 on the right-hand rest 127 in FIG. 1 is filled with wafers, the other following wafers are conveyed into the cassette 126 on the left-hand rest 127 in FIG. 1 as the full cassette 126 on the right-hand rest 127 is replaced by an empty cassette 126.

A stopper 124 is provided between the right and left conveyor belts 129, which stopper 145 is moved up and down by an air cylinder 123. A stopper 133 is provided on the left-hand portion of the guide rest 28. Guide bars 134 are provided on the intermediate portion of the guide rest 128. When the wafer 3 is to be conveyed into the left hand cassette 126, the stopper 145 is lowered to displace the wafer over the stopper, and then the wafer is halted by the stopper 133. When the wafer 3 is to be conveyed into the right-hand cassette 126, the stopper 124 is raised to halt the wafer.

If only one cassette is disposed in the unloader 125, only one rest 127 need be provided in an optional position opposed to the conveyor belts 129, similarly to the loader 1.

When the following wafer 3 is moved between the sticking rollers 45 and 46 as the tape peeling device 54, having peeled the adhesive tape 51, remains in the vicinity of the roller 45 and stopped, the braking of the roller 46 is ceased, the leftward movement of the tape peeling device in FIG. 14 is started, and the tape is wound on the winding reel 52 so that the tape is stuck to the wafer. The wafer is then moved onto the suction stage 108, and the following step is begun.

A mechanism is provided to move up and down the lower sticking roller 46 (shown in FIG. 2) together with the drive/brake unit 47.

The peeling roller 56 and the separator elevation roller 61 can optionally be rotated backward or forward or be stopped.

The pinch rollers 53 and 62 can optionally be put into or out of contact with the separator elevation roller 61.

Figure 16:
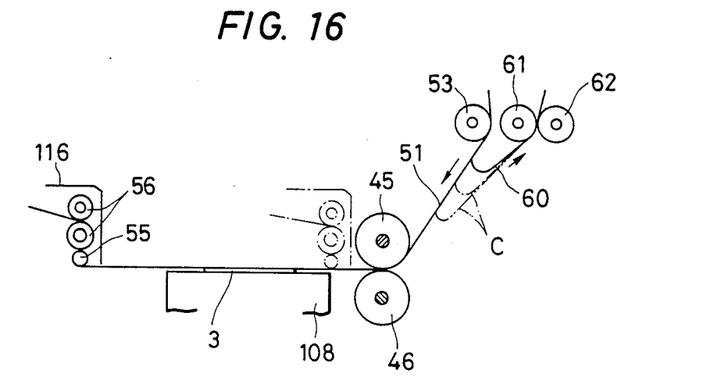
FIGS. 16 and 17 are side views and are used for explaining operations in the preferred embodiment.

When the adhesive tape 51 is to be fed and stuck to the wafer 3, the rollers 56 and 61 are stopped, the pinch roller 53 is moved out of contact with the separator elevation roller 61, and the moving rest 116 is moved from a position (shown by a chain line in FIG. 6) to a position (shown by a full line in FIG. 16) so that the tape and the wafer are stuck to each other and conveyed to a prescribed position. At that time, the adhesive tape 51 with the separator 60 is processed as indicated by chain lines C in FIG. 16. After the wafer 3 is stopped in the prescribed position, the rollers 61 and 62 are brought into contact with the separator 60 during the cutting of the adhesive tape 51 to raise the separator. The peeling of the separator 60 from the tape 51 is thus prevented from producing an adverse effect.

Figure 17:
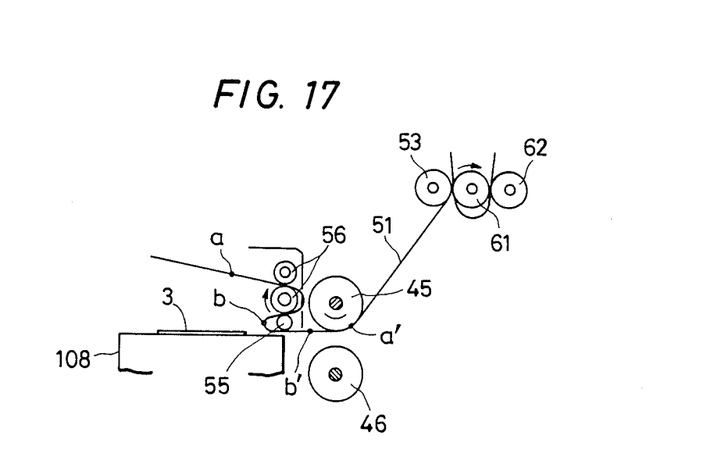

After the cutting of the adhesive tape 51 is completed in a state shown in FIG. 13, the rollers 53 and 61 are brought into contact with each other, the sticking rollers 45 and 46 are moved out of contact with each other, and the rollers 53, 61 and 56 are rotated backward to wind back the tape by a desired length to shorten the length of the tape between the wafers 3. In other words, points a and b on the tape 51 shown in FIG. 17 correspond to preceding wafers, and a point a' on the tape corresponds to a following wafer. The rollers 56 and 61 are rotated backward in the directions of arrows (shown in FIG. 17) to return the point b to a point b' to shorten the length (from the point b' to the point a') of the tape between the wafers.

The sticking roller 46 is raised only when the wafer 3 and the adhesive tape 51 are to be stuck to each other. After the wafer 3 has passed through the sticking roller 46, the roller is lowered and kept out of contact with the other sticking roller 45. As a result, the adhesive tape 51 can be wound back without needlessly sticking the adhesive side of the tape to some part of the device or to a following wafer.

According to the present invention as described above, an operation in which thin articles placed in cassettes are extracted one by one therefrom and conveyed between sticking rollers, an operation in which an adhesive tape, having an adhesive side on its lower surface and continuously stuck to the thin article between the sticking rollers and the tape with the thin articles stopped on a stage, is cut off along the peripheral edge of the thin article, an operation in which the tape is peeled to leave a cut-off piece stuck to the thin article secured by suction on a suction stage, and an operation in which the thin article passed through a tape peeling device is placed into a cassette are performed in a fully automatic manner. For that reason, the efficiency of the cutting and peeling of the adhesive tape is much higher than in a conventional manual operation, and the cutting and peeling of the tape according to the present invention are accurately performed.

According to an other feature of the present invention, the adhesive tape is is stably cut off along the peripheral edge of the thin article without damaging the straight edge (orientation edge) of the thin article.

According to still another aspect of the present invention, the adhesive tape is very sharply cut off by a pointed-knife-type cutter. When it is sensed by a detector that the thin article has a chip or that the cutter has deviated in the radial or circumferential direction of the thin article the cutting of the tape is immediately stopped to avoid damaging the thin article.

According to still another aspect of the present invention, an adhesive tape made of a thermoplastic material, which is difficult to cut at room temperature, can be easily cut off.

According to still another aspect of the present invention, the adhesive tape is controlled to shorten the length thereof between preceding and succeeding wafers to reduce the comsumption of the tape and to decrease the cost of materials.

What is claimed:

1. A device for adhering an adhesive tape having a width greater than a width of a thin article to said thin article and trimming excess portions of said tape from said thin article, comprising: a plurality of sticking roller for applying adhesive tape from a roll to a thin article, said tape having an adhesive side oriented towards a surface of said thin article; a loader for removing thin articles from a cassette and conveying them one-by-one between said rollers for application of said adhesive tape; a vacuum stage receiving and holding each of said thin articles with said adhesive tape stuck thereto; tape cutting means for trimming excess portions of said tape while said thin article is held on said stage, wherein said tape cutting means comprises a cutter attachment member comprising a cutter holder easily attachable to and detachable from said cutter attachment member, for holding a cutter at a lower end thereof, an edge detector movable along with said cutter blade for sensing peripheral edge portions of said thin article, and means for guiding said cutter blade in directions tangential to said peripheral edge portions of said thin article in response to a signal produced by said detector, said cutter blade being turned around a center of said thin article;

tape peeling means for peeling off the trimmed excess portions of said adhesive tape;

unloading means for conveying said thin article from said stage to a cassette;

means for rewinding said adhesive tape onto said roll after said adhesive tape has been trimmed from that adhering to said thin article so as to avoid lengthwise wastage of said adhesive tape, pinch rollers for advancing said adhesive tape from said roll to said sticking rollers, wherein said peeling means comprises peeling rollers for peeling off said trimmed excess portions of said adhesive tape, and wherein said rewinding means comprises drive means for rotating said pinch rollers and said peeling rollers reversely to rewind said tape.

2. The device of claim 1, wherein said tape cutting means comprises a cutter attachment member comprising heating means, and a cutter holder easily attachable to and detachable from said cutter attachment member for holding a cutter at a lower end of said cutter holder.

3. The device of claim 1, further comprising means for mounting said cutting means above said thin article held on said stage and lowering said cutting means for trimming said excess portions of said adhesive tape.

4. The device of claim 1, wherein said cutter blade is a pointed-knife-type cutting blade.

5. The device of claim 1, further comprising a chip detector for sensing the presence of chips from said thin articles and stopping said cutting means when a chip is detected.

6. The device of claim 1, further comprising an abnormality detector for sensing the abnormalities in operations of said cutting means and stopping said cutting means when an abnormality is detected.

7. The device of claim 1, further comprising a detector for detecting a straight peripheral portion of said thin article, and means for guiding said cutting means along said straight peripheral portion in response to an output of said detector.

8. The device of claim 1, wherein said cutter attachment member further comprises heating means.

9. A device for sticking adhesive tape having a width greater than width of a thin article to said thin article and trimming excess portions of said tape from said thin article, comprising: a plurality of sticking rollers for applying adhesive tape from a roll to a thin article, said tape having an adhesive side oriented towards an upper surface of said thin article; a loader for removing thin articles form a cassette and conveying them one-by-one between said rollers for application thereto of said adhesive tape by said sticking rollers; a stage receiving and holding each of said thin articles with said adhesive tape stuck thereto by said sticking rollers; tape cutting means for trimming excess portions of said thin article held on said stage; tape peeling means for peeling off the trimmed excess portion of said adhesive tape from said thin article held on said stage; and unloading means for conveying said thin article from said stage to a cassette, wherein said tape and cutting means comprises a cutter which is displace dot a position over a port of a straight peripheral portion of the thin articles and then moved down to out said adhesive tape, a detector which is moved together with said cutter to sense a portion of an arc-shaped circumferential surface continuous to an end of said straight peripheral portion so that said cutter moves along said straight peripheral portion, and means for changing a direction of said cutter to a direction of a tangent to a circumferential surface of said thin article in response to a detection signal from detector so that said cutter is turned about a center of contact of said cutter and said thin article, and said cutter is turned about a center of said thin article to move along said peripheral portion of said thin article.

* * * * *